(12) United States Patent
Sulkin

(10) Patent No.: US 9,379,605 B2
(45) Date of Patent: Jun. 28, 2016

(54) CLOCKING CIRCUIT, CHARGE PUMPS, AND RELATED METHODS OF OPERATION

(71) Applicant: SAMSUNG ELECTRONICS CO., LTD., Suwon-Si, Gyeonggi-Do (KR)

(72) Inventor: Alex Sulkin, Calgary (CA)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 8 days.

(21) Appl. No.: 14/456,596

(22) Filed: Aug. 11, 2014

(65) Prior Publication Data

US 2016/0043637 A1 Feb. 11, 2016

(51) Int. Cl.
*G05F 1/10* (2006.01)
*H02M 3/07* (2006.01)
*H03K 3/356* (2006.01)

(52) U.S. Cl.
CPC ........... *H02M 3/07* (2013.01); *H03K 3/356121* (2013.01)

(58) Field of Classification Search
None
See application file for complete search history.

(56) References Cited

U.S. PATENT DOCUMENTS

| 5,612,861 | A | 3/1997 | Zhong et al. |
| 5,623,222 | A | 4/1997 | Tamagawa |
| 6,922,097 | B2 | 7/2005 | Chan et al. |
| 6,960,955 | B2 | 11/2005 | Nonaka |
| 7,113,023 | B2 | 9/2006 | Cernea |
| 7,602,233 | B2 | 10/2009 | Pietri et al. |
| 8,508,078 | B2 * | 8/2013 | Posat ................. H03K 17/0822 307/127 |
| 8,981,835 | B2 * | 3/2015 | Pan ....................... H02M 3/073 327/536 |
| 2006/0227577 | A1 | 10/2006 | Horiuchi et al. |
| 2011/0101938 | A1 | 5/2011 | Ma et al. |
| 2011/0163797 | A1 * | 7/2011 | Posat ................. H03K 17/0822 327/537 |
| 2012/0268044 | A1 | 10/2012 | Shvartsman |
| 2013/0222050 | A1 * | 8/2013 | Siao ...................... H02M 3/073 327/536 |
| 2013/0307612 | A1 * | 11/2013 | Chao ...................... H02M 3/07 327/536 |
| 2014/0077868 | A1 * | 3/2014 | Kalluru .................. G11C 5/145 327/536 |
| 2014/0097887 | A1 * | 4/2014 | Aebischer ............... H02M 3/00 327/536 |

* cited by examiner

*Primary Examiner* — Cassandra Cox
(74) *Attorney, Agent, or Firm* — Volentine & Whitt, PLLC

(57) ABSTRACT

A charge pump includes a voltage multiplier core and a clocking circuit. The voltage multiplier core includes first and second cross-coupled CMOS devices, first and second output CMOS devices, a first capacitive node coupled between the first cross-coupled CMOS device and the first output CMOS device, and a second capacitive node coupled between the second cross-couple CMOS device and the second output CMOS device. The clocking circuit configured to control the first and second output CMOS devices to inhibit a drop in respective output voltages there from, while simultaneously controlling the first and second cross-coupled CMOS device and input voltages applied to the first and second capacitive nodes to minimize leakage from the first and second capacitive nodes.

9 Claims, 9 Drawing Sheets

CLOCKING CIRCUIT, CHARGE PUMPS, AND RELATED METHODS OF OPERATION

BACKGROUND

The inventive concept is generally directed to CMOS cross-coupled charge pumps, and more particularly, to the generation of clock signals for driving CMOS cross-couple charge pumps.

Semiconductor integrated circuits may include components requiring relatively high voltages due to operating characteristics thereof. As such, these circuits may be equipped with charge pumps to generate high voltages that are higher than a power voltage of the semiconductor integrated circuit. For example, a liquid crystal display driver for driving a thin-film transistor may utilize charge pumps to obtain various boosted drive voltages that are needed. As another example, flash memory devices may utilize charge pumps to obtain boosted voltages that are needed during programming of memory cells.

Trends of reducing size and power consumption of semiconductor integrated circuits create demands to improve voltage boosting efficiency and power efficiency of charge pumps contained in such circuits.

SUMMARY

According to an aspect of the inventive concepts, a charge pump is provided which includes a voltage multiplier core and a clocking circuit. The voltage multiplier core includes first and second cross-coupled CMOS devices, first and second output CMOS devices, a first capacitive node coupled between the first cross-coupled CMOS device and the first output CMOS device, and a second capacitive node coupled between the second cross-couple CMOS device and the second output CMOS device. The clocking circuit is configured to control the first and second output CMOS devices to inhibit a drop in respective output voltages there from, while simultaneously controlling the first and second cross-coupled CMOS device and input voltages applied to the first and second capacitive nodes to minimize leakage from the first and second capacitive nodes.

The first and second cross-coupled CMOS devices may be NMOS transistors, and the first and second output CMOS devices may be PMOS devices.

A capacitive element and an inverter may be coupled in series to each of the first and second capacitive nodes.

The clocking circuit may include a first clock generator configured to generate a non-overlapping first pair of inverted clock signals and a non-overlapping second pair of inverted clock signals which are synchronized with the first pair of inverted clock signals, and a second clock generator configured to generate an overlapping third pair of inverted clock signals which are synchronized with the first and second pair of inverted clock signals. Respective transitions of the first pair of inverted clock signals are separated in time by a first transition window, wherein respective transitions of the second pair of inverted clock signals are separated in time by a second transition window which overlaps the first transition window, and each transition of the third pair of inverted clock signals occurs in the first and second transition windows of the respective first and second pairs of inverted clock signals.

The clocking circuit may further include a first booster circuit configured to voltage boost the second pair of inverted clock signals, and a second booster circuit configured to voltage boost the third pair of inverted clock signals.

The boosted second pair of inverted clock signals may be respectively gated to the NMOS transistors, the boosted third pair of inverted clock signals may be respectively gated to the PMOS transistors, and the first pair of inverted clock signals may be respectively gated to inputs of the first and second inverters.

The first clock generator may receive a main clock signal, and the second clock generator may include a delay element having an input which receives the main clock signal and output which generates a first one of the third pair of inverted clock signals, and an inverter having an input which receives the first one of the third pair of inverted clock signals, and an output which generates a second one of the third pair of inverted clock signals.

The clocking circuit may further include a first booster having a first input coupled to the output of the delay element, a second input coupled to the output of the inverter, and first and second outputs generating an overlapping pair of boosted inverted clock signals.

According to another aspect of the inventive concepts, a clocking circuit is provided which includes a first clock generator configured to generate a non-overlapping first pair of inverted clock signals and a non-overlapping second pair of inverted clock signals which are synchronized with the first pair of inverted clock signals, and a second clock generator configured to generate an overlapping third pair of inverted clock signals which are synchronized with the first and second pair of inverted clock signals. Respective transitions of the first pair of inverted clock signals are separated in time by a first transition window, respective transitions of the second pair of inverted clock signals are separated in time by a second transition window which overlaps the first transition window, and each transition of the third pair of inverted clock signals occurs in the first and second transition windows of the respective first and second pairs of inverted clock signals.

Each transition of the third pair of inverted clock signals may occur at a center of the transition windows of the respective first and second pairs of inverted clock signals.

The clocking circuit may further include a first booster circuit configured to voltage boost the second pair of inverted clock signals, and a second booster circuit configured to voltage boost the third pair of inverted clock signals, where the first pair of inverted clock signals are output from the clocking circuit without being applied to a voltage boosting circuit.

Each of the first and second boosting circuits may be a voltage multiplier comprising cross-coupled CMOS devices.

The first clock generator may receive a main clock signal, and the second clock generator may include a delay element having an input which receives the main clock signal and output which generates a first one of the third pair of inverted clock signals, and an inverter having an input which receives the first one of the third pair of inverted clock signals, and an output which generates a second one of the third pair of inverted clock signals.

The clocking circuit may further include a first boosting circuit having a first input coupled to the output of the delay element, a second input coupled to the output of the inverter, and first and second outputs generating an overlapping pair of boosted inverted clock signals.

According to yet another aspect of the inventive concept, a method of controlling a voltage multiplier core is provided where the voltage multiplier core includes first and second cross-coupled CMOS devices, first and second output CMOS devices, a first capacitive node coupled between the first cross-coupled CMOS device and the first output CMOS device, and a second capacitive node coupled between the second cross-couple CMOS device and the second output CMOS device. The method includes controlling the first and second output CMOS devices to inhibit a drop in respective output voltages there from, while simultaneously controlling the first and second cross-coupled CMOS device and input voltages applied to the first and second capacitive nodes to minimize leakage from the first and second capacitive nodes.

BRIEF DESCRIPTION OF THE DRAWINGS

The above and other aspects and features of the inventive concept will become readily understood from the detailed description that follows, with reference to the accompanying drawings, in which.

DETAILED DESCRIPTION OF EMBODIMENTS

Embodiments of the inventive concept are described below with reference to the accompanying drawings. These embodiments are presented as teaching examples and should not be construed to limit the scope of the inventive concept.

In the description that follows, the terms first, second, etc. may be used to describe various elements, but these elements should not be limited by these terms. Rather, these terms are used merely to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
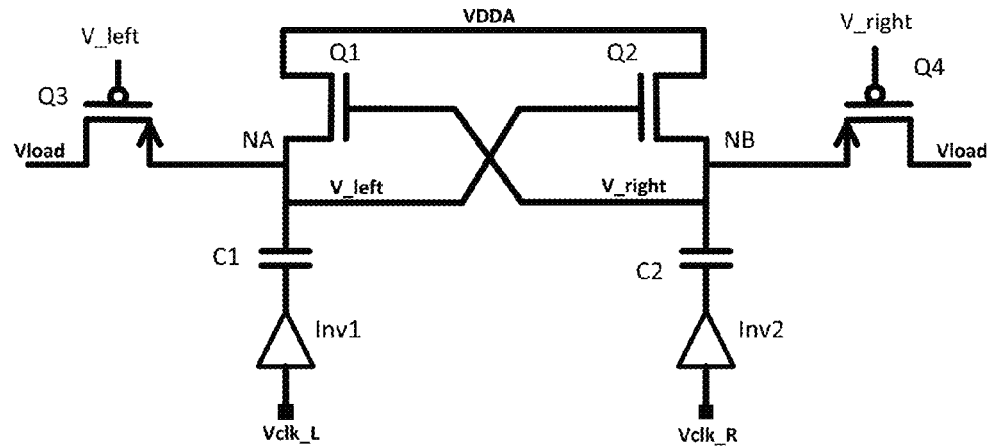
FIG. 1 is a circuit diagram illustrating a basic CMOS cross-coupled charge-pump type voltage doubler.

A basic CMOS cross-coupled charge-pump type voltage doubler is illustrated in FIG. 1.

As shown in FIG. 1, the voltage doubler includes NMOS transistors Q1 and Q2, PMOS transistors Q3 and Q4, capacitors C1 and C2, and inverters Inv1 and Inv2. The NMOS transistor Q1 is gated to node NB, and is coupled between a source voltage VDDA and node NA. The NMOS transistor Q2 is gated to node NA, and is coupled between source voltage VDDA and node NB. The PMOS transistor Q3 is gated to receive a clock signal V_right, and is coupled between a load (not shown) and node NA. The PMOS transistor Q4 is gated to receive a left-side control clock V_left, and is coupled between the load and node NB. The inverter Inv1 and capacitor C1 are series coupled to node NA, with an input of the inverter Inv1 coupled to a clock terminal receiving a left-side clock signal Vclk_L. The inverter Inv2 and capacitor C2 are series coupled to node NB, with an input of the inverter Inv2 coupled to a clock terminal receiving a right-side clock signal Vclk_R. The clock signals Vclk_L and Vclk_R are inverted relative to each other, as are clock signals V_left and V_right.

In operation, when clock signal Vclk_L is high, transistor Q2 is turned off. At the same time clock signal Vclk_R is low, thus turning on transistor Q1. As a result, capacitor C1 is charged to VDDA via transistor Q1. When clock signal Vclk_L goes low, the output of inverter Inv1 goes high and the top plate of C1 (i.e., node NA) is pushed up to twice VDDA (i.e., 2VDDA). At the same time clock signal V_left is low, so that this voltage 2VDDA appears at the output as voltage Vload. Also at the same time, the transistor Q2 is turned on allowing C2 to charge. In the next half cycle the operation is inverted, namely, Vclk_L is high, Vclk_R is low, V_left is high, and V_right is low. In this manner, the output Vload is alternately supplied as 2VDDA from each side of the circuit.

The basic voltage doubler of FIG. 1 uses a single clock (and its inverse) in order to produce a voltage which is higher than VDDA. Charge pumps having cross-coupled transistors inevitably have a substantial amount of reversion loss caused by charge transfers from nodes having higher voltage to nodes having lower voltage. This type of charge loss causes the output voltage to deviate from its ideal boosting level and to have a switching ripple.

There are several methods to deal with leakages that occur in the basic cross-coupled topology of FIG. 1. Generally, they involve designing more complex clocking schemes that drive the voltage doubler, while the underlying operation principle of the charge pump itself remains virtually unchanged. Some of these schemes adopt a "2-phase" clocking scheme as will be explained next.

Figure 2A:
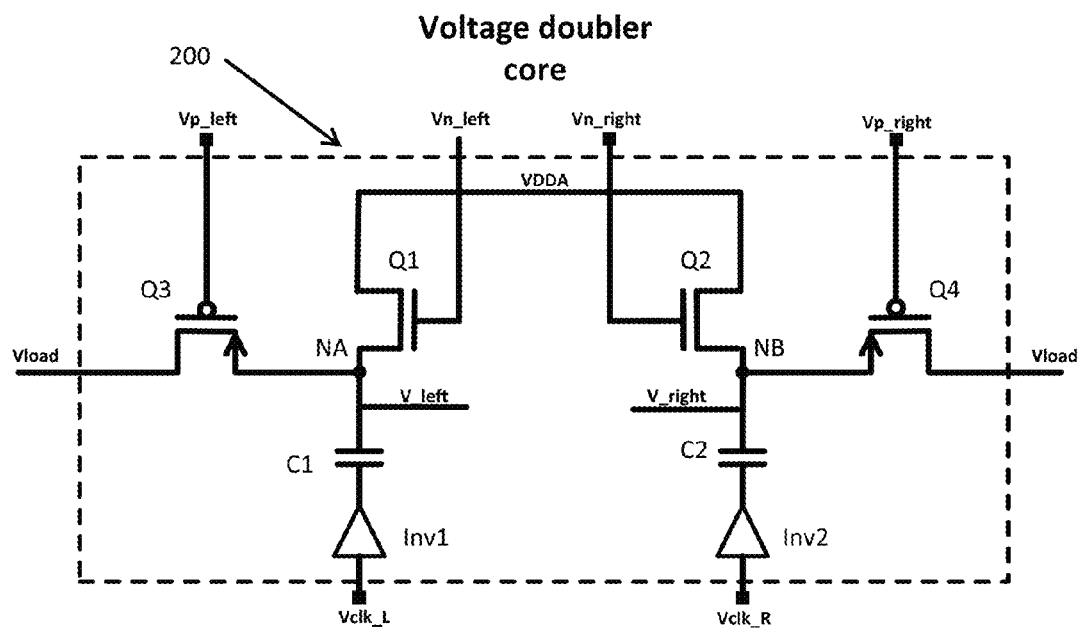
FIG. 2A is a circuit diagram illustrating a CMOS cross-coupled charge-pump type voltage doubler core which is driven by a 2-phase clocking scheme.

FIG. 2A illustrates a voltage doubler core which, in this example, is configured of the same components as the basic voltage doubler of FIG. 1. The voltage doubler of FIG. 2A is differentiated from that of FIG. 1 by the NMOS transistor Q1 being gated to a terminal supplied with a clock signal Vn_left, and the NMOS transistor Q2 being gated to a terminal supplied with a clock signal Vn_right. Also, in FIG. 2A, the PMOS transistor Q3 is gated to a terminal supplied with a clock signal Vp_left, and the PMOS transistor Q4 is gated to a terminal supplied with a clock signal Vp_right.

Figure 2B:
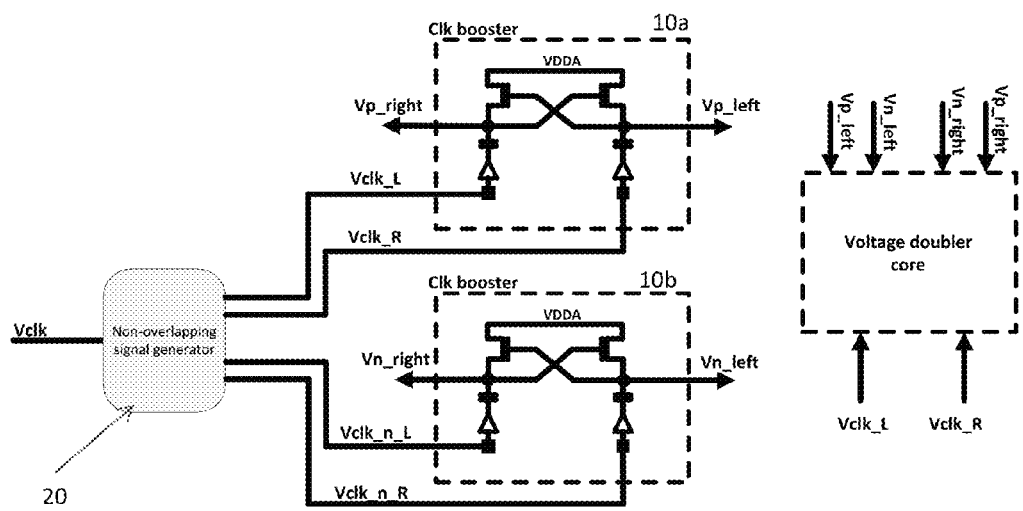
FIG. 2B is a circuit diagram illustrating a 2-phase clocking topology for driving the voltage doubler core of FIG. 2A.

Referring additionally to FIG. 2B, the 2-phase clocking scheme introduces two pairs (hence, the term "2-phase") of non-overlapping clock signals (Vn_left, Vp_left, Vn_right and Vp_right) that are boosted by much smaller clock (Clk) booster cells 10a and 10b. Generally, the clock booster cells 10 do not drive current but may be configured similarly to FIG. 1. As shown in FIG. 2B, a non-overlapping signal generator 20 receives a main clock signal Vclk, and generates therefrom clock signals Vclk_L and Vclk_R applied to the inverter inputs of Clk booster cell 10a, and clock signals Vclk_n_L and Vclk_n_R applied to the inverter inputs of Clk booster cell 10b. The Clk booster cell 10a and 10b operate in essentially the same manner as the basic voltage doubler of FIG. 1. That is, the Clk booster cell 10a generates boosted clock signals Vp_right and Vp_left, and the Clk booster cell 10b generates boosted clock signals Vn_right and Vn_left.

Figure 3:
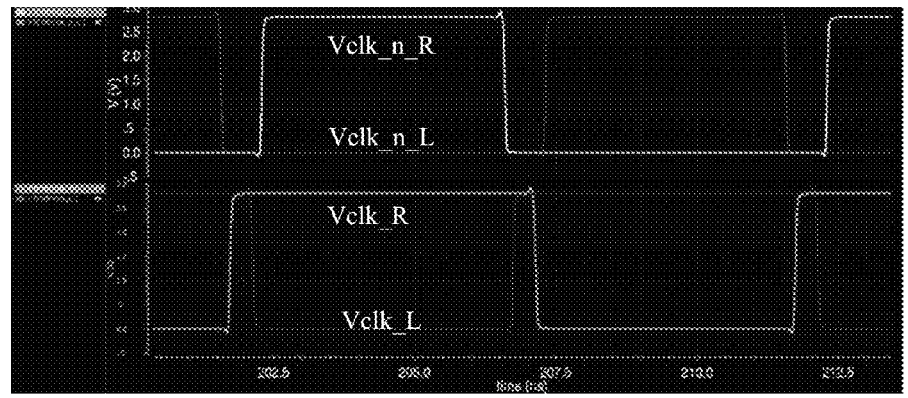
FIG. 3 is a waveform diagram of 2-phase clock signals of the 2-phase clocking topology of FIG. 2B.

Exemplary waveforms of the non-overlapping 2-phase clock signals generated by the non-overlapping signal generator 20 are illustrated in FIG. 3.

As can be seen in the example of FIG. 3, the first pair of clocks signals Vclk_L and Vclk_R are inverted relative to each other, and the on-pulse width of each clock signal Vclk_L and Vclk_R is greater than the off-pulse width thereof. Likewise, the second pair of clock signals Vclk_n_L and Vclk_n_R are inverted relative to each other, and the on-pulse width of each clock signal Vclk_n_L and Vclk_n_R is less than the off-pulse width thereof. In this context, each of the first and second pairs of clock signals are said to be "non-overlapping".

The four boosted clock signals Vp_right, Vp_left, Vn_right and Vp_right, and the two un-boosted clock signals Vclk_L and Vclk_R, drive the voltage doubler core of FIG. 2A. Namely, the boosted clock signals Vp_left and Vp_right are respectively gated to the PMOS transistors Q3 and Q4, the boosted clock signals Vn_left and Vn_right are respectively gated to the NMOS transistors Q1 and Q2, and the un-boosted clock signals Vclk_L and Vclk_R are respectively applied to the inputs of the inverters Inv1 and Inv2.

The clocking scheme prevents of FIGS. 2A and 2B introduces "dead zones" at clock transitions to prevents or minimize leakage losses in the configuration of FIG. 1.

Herein, the output current is denoted by Iload_L for the left hand-side PMOS of FIG. 2A, and the output current is denoted by Iload_R for the right-hand side PMOS of FIG. 2A. During aforementioned "dead-zones" no current flows between the NA/NB nodes and Vload outputs, thus preventing leakage from these nodes at switching or transition times. Disadvantageously, however, it also prevents the desired forward flowing current to charge the Vload capacitance, therefore exhibiting a voltage drop at the Vload output. This can be readily seen in FIG. 4.

Figure 4:
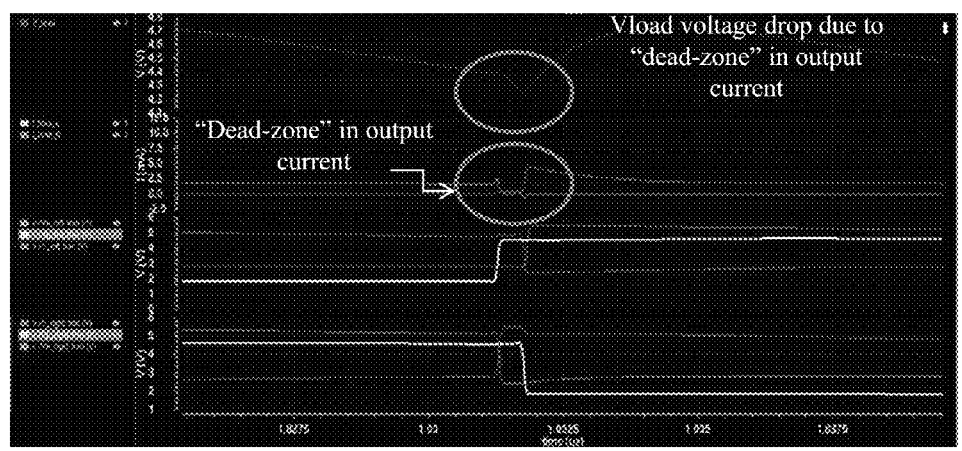
FIG. 4 is a waveform diagram for reference in describing a current dead zone in the voltage doubler core of FIG. 2A resulting from the 2-phase clocking topology of FIG. 2B.

Referring to FIG. 4, waveforms are illustrated for clock signals Vn_right, Vp_right and V_right, as well as for clock signals Vn_left, Vp_left and V_left. As described above, these are the six clock signals applied to the voltage doubler core of FIG. 2A. Also shown in FIG. 4 are the output currents I_load_L and I_load_R, which exhibit dead zones at overlapping transition regions of the clock signals Vn_right, Vp_right and V_right, and the clock signals Vn_left, Vp_left and V_left. This results in a voltage drop at the Vload output as is illustrated in FIG. 4.

An embodiment of the inventive concept will now be described with reference to FIG. 5.

Figure 5:
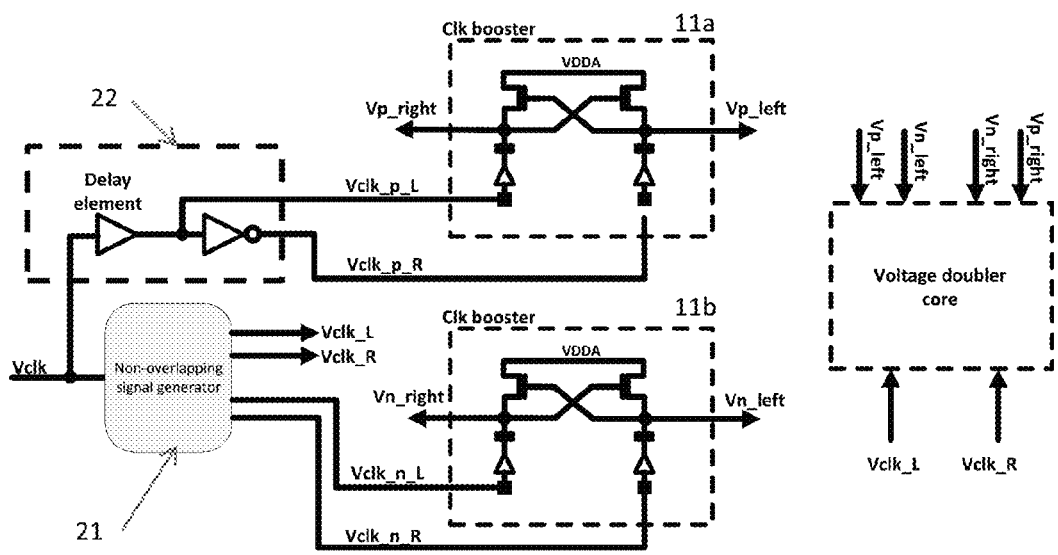
FIG. 5 is a circuit diagram illustrating a 3-phase clocking topology for driving the voltage doubler of FIG. 2A according to an embodiment of the inventive concept.

Referring to FIG. 5, a clocking circuit of an embodiment includes a first clock (Clk) booster cell 11a, a second Clk booster cell 11b, an overlapping signal generator 21, and a non-overlapping signal generator 22. Clock signal outputs are utilized to drive a voltage double core 200 such as that shown and described above in connection with FIG. 2A.

Embodiments of the inventive concept are referred to herein as implementing a "3-phase" clocking scheme to drive the voltage doubler core 200. This phraseology is adopted since an overlapping third clock signal pair (denoted as Vclk_p_L and Vclk_p_R in the examples presented below) is introduced in addition to two non-overlapping pairs of clock signals (denoted Vclk_p_L and Vclk_p_R, and Vclk_n_L and Vclk_n_R in the examples presented below). As will be described, the overlapping third clock signal pair is timed with two non-overlapping clock signal pairs. Embodiments of the inventive concept make it possible to eliminate undesired leakage losses without introducing "dead-zones" in the output currents (Iload_left and Iload_right).

Referring to FIG. 5, the non-overlapping signal generator 21 may be configured in the same manner as this non-overlapping signal generator 20 illustrated in FIG. 2A described above.

Figure 6:
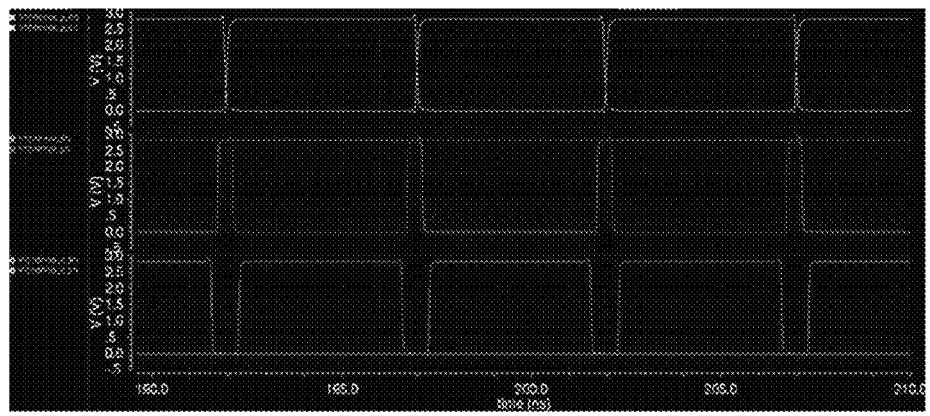
FIG. 6 is a waveform diagram of 3-phase clock signals of the 3-phase clocking topology of FIG. 5 according to an embodiment of the inventive concept.

In this case, referring to FIG. 6, the non-overlapping signal generator 21 generates a first pair of non-overlapping clock signals Vclk_L and Vclk_R, and a second pair of non-overlapping clock signals Vclk_n_L and Vclk_n_R. Here, the first pair of clocks signals Vclk_L and Vclk_R are inverted relative to each other, and the on-pulse width of each clock signal Vclk_L and Vclk_R is greater than the off-pulse width thereof. In other words, the respective transitions of the clock signals Vclk_L and Vclk_R are separated in time by a gap or window. Likewise, the second pair of clock signals Vclk_n_L and Vclk_n_R are inverted relative to each other, and the on-pulse width of each clock signal Vclk_n_L and Vclk_n_R is less than the off-pulse width thereof. Again, the respective transitions of the clock signals Vclk_n_L and Vclk_n_R are separated in time by a gap or window which overlaps (or is synchronized with) the aforementioned transition gap or window of the clock signals Vclk_L and Vclk_R. It will be understood that the non-overlapping signal generator 21 is physically implemented by circuitry the specific design of which can be varied greatly and is well within the purview of one skilled in the art.

Still referring to FIG. 5, the overlapping signal generator 22 generates overlapping clock signals Vclk_p_L and Vclk_p_R. These clock signals are inverted relative to each other, but unlike their non-overlapping counterparts, the transitions of the clock signals Vclk_p_L and Vclk_p_R occur at the same time.

One example of the overlapping signal generator 22 is illustrated in FIG. 5 as a delay element and an inverter connected in series and receiving the main clock signal Vclk. Here, the clock signal Vclk_p_L may be derived at the output of the delay element, and the clock signal Vclk_p_R may be derived at the output of the inverter. However, the overlapping signal generator 22 is not limited in this manner and other circuit designs may be readily adopted. Also, the non-overlapping signal generator 21 and the overlapping signal generator 22 may be physical combined into a single circuit block or unit.

As represented in FIG. 6, the frequency of the illustrated clock signals is the same. As a non-limiting example only, the pulse-width of each clock signal may be on the order of 10 ns.

The Clk booster cells 11a and 11b may be configured in the same manner as the Clk booster cells 10a and 10b described above in connection with FIG. 2B. As shown in FIG. 5, the overlapping clock signals Vclk_p_L and Vclk_p_R are applied to the inverter inputs of Clk booster cell 11a, and the non-overlapping clock signals Vclk_n_L and Vclk_n_R applied to the inverter inputs of Clk booster cell 10b. As a result, the Clk booster cell 10a generates boosted overlapping clock signals Vp_right and Vp_left, and the Clk booster cell 10b generates boosted non-overlapping clock signals Vn_right and Vn_left.

Referring to FIG. 5 and FIG. 2A, the non-overlapping clock signals Vclk_L and Vclk_R are applied as inputs to the respective inverters Inv1 and Inv2 of the voltage doubler core 200, and the boosted non-overlapping clock signals Vn_left and Vn_right are applied to the respective gates of the NMOS transistors Q1 and Q2.

In the meantime, the boosted overlapping clock signals Vp_left and Vp_right are applied to the respective gates of the PMOS transistors Q3 and Q4.

In the clocking configuration described above in connection with FIG. 5, it will be apparent that due to the overlapping configuration of the clock signals Vp_left and Vp_right, the PMOS transistors Q3 and Q4 are transition in opposite directions substantially at the same time. In particular, the left-side PMOS transistor Q3 is maintained in an on-state during transition of right-side NMOS transistor Q2 to an off-state, and right-side clock signal Vclk_R to a high-state. Likewise, the right-side PMOS transistor Q4 is maintained in an on-state during transition of left-side NMOS transistor Q1 to an off-state, and during transition of right-side clock signal Vclk_R to a logic high-state.

This means that at a time where clock signals Vclk_L and Vclk_R are both high (VDDA) and Vclk_n_L and Vclk_n_R are both low (VSSA), no leakage current will flow between the V_left/V_right nodes (NA/NB) and Vload, therefore this time window is ideal for toggling the PMOS switches (using the Vp_left and Vp_right clock signals). In this manner, the node Vload is connected to high voltage (either V_left or V_right) for the entirety of the cycle time, thus preventing dead-zones in Iload_left/Iload_right and preventing a drop in Vload. As illustrated in FIG. 6, an embodiment of the inventive concept may be characterized by the transition of overlapping clock signals Vclk_p_L and Vclk_p_R occurring during or at the middle of the afore-discussed transition windows which may be defined by the condition: Vclk_n_L/Vclk_n_R=low & Vclk_L/Vclk_R=high.

Figure 7:
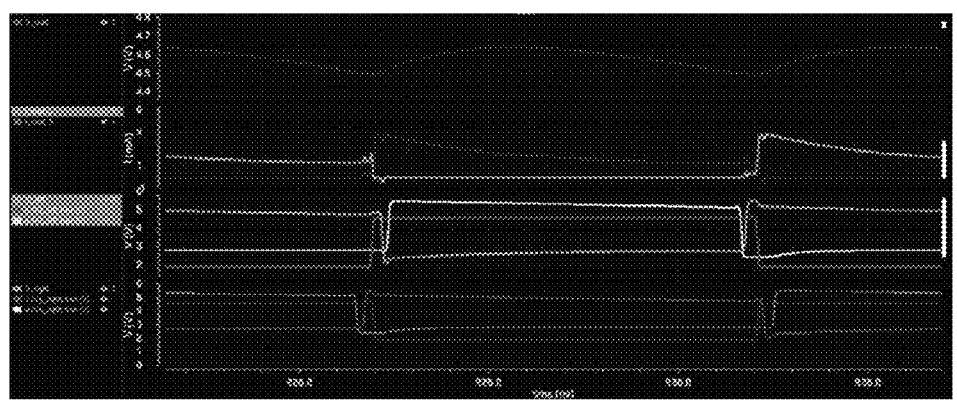
FIG. 7 is a waveform diagram for reference in describing the lack of a current dead zone in the voltage doubler core of FIG. 2A resulting from the 3-phase clocking topology of FIG. 5.

The resulting currents and voltages are shown in FIG. 7. When contrasted with FIG. 4, it can be seen from FIG. 7 that the embodiment results in a lack of dead-zones in Iload_left/Iload_right, as well as lack of voltage drop in Vload.

It is noted that the as the pumping frequency increases, then the impact of the "dead-zones" on the Vload voltage drop becomes crucial. This is because as the period of the switching decreases the "dead-zones" occupy a relatively larger portion thereof.

Figure 8:
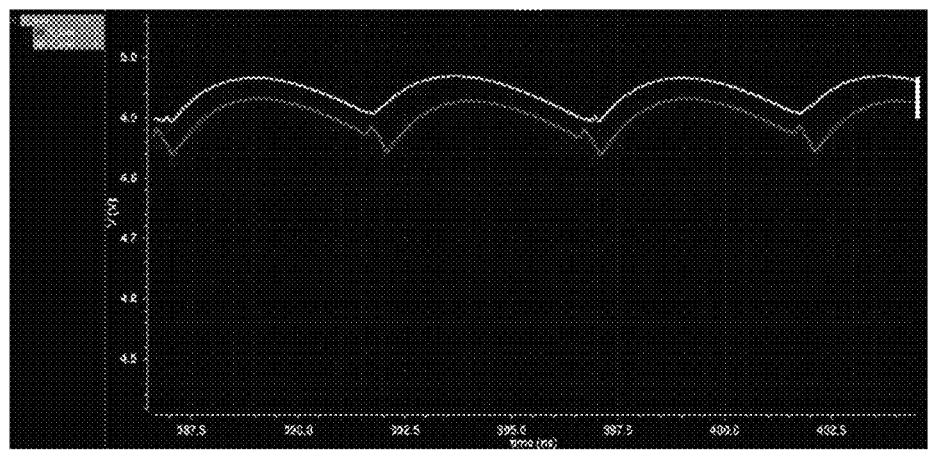
FIG. 8 is a waveform diagram for reference in comparing a load voltage output resulting from the 2-phase clocking topology of FIG. 2A and the 3-phase clocking topology of FIG. 5.

As explained above, a clocking configuration for a cross-coupled voltage doubler according to embodiments of the inventive concept is effective to eliminate or reduce the leakage losses without introducing "dead-zones" in the output currents that cause a Vload voltage drop. As illustrated in the comparative diagram of FIG. 8, the result is a more flat and less noisy output voltage, as well as a higher DC output voltage, relative to the clocking scheme of FIG. 2B.

The charge pumps described above and related clock generation circuits according to embodiments of the inventive concepts may be advantageously included in a wide variety of electronic or semiconductor devices. Examples of such devices are presented below with reference to FIGS. 9-14.

Figure 9:
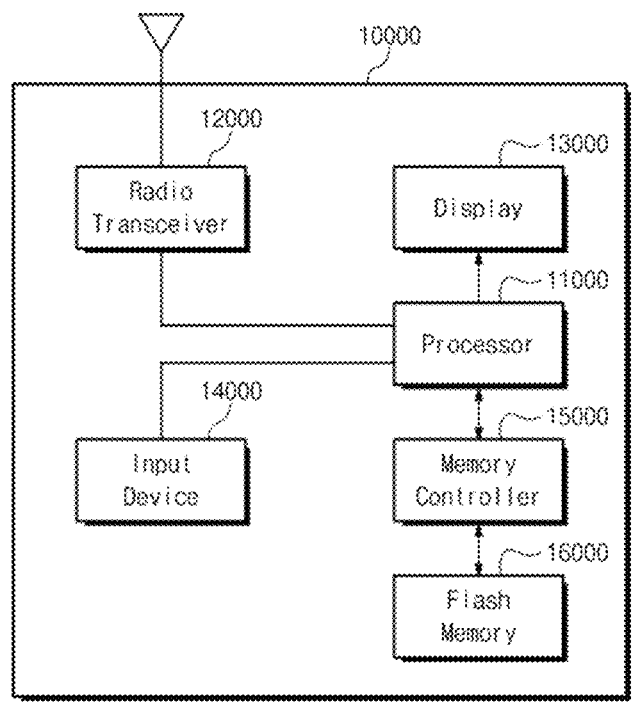
FIGS. 9, 10, 11, 12 and 13 illustrate examples of electronic devices adopting one or more embodiments of the inventive concept.

FIG. 9 is a block diagram illustrating an electronic device 10000 which may adopt charge pumps and clock generation schemes according to an embodiment of inventive concept.

Referring to FIG. 9, electronic device 10000, such as a cellular phone, a smart phone, or a tablet PC comprises a non-volatile memory device 16000 formed of a flash memory device and a memory controller 15000 controlling an operation of non-volatile memory device 16000.

Non-volatile memory device 16000 may, for example, include charge pumps coupled to clock generation circuits according to embodiments of inventive concept in order to generate high voltages needed in programming memory cells.

Data stored in non-volatile memory device 16000 may be displayed via a display 13000 under the control of memory controller 15000 that operates in response to the control of a processor 11000. A radio transceiver 12000 may transmit and receive a radio signal via an antenna. For example, radio transceiver 12000 may convert a radio signal received via the antenna to a signal suitable for processor 11000 to process. Processor 11000 may process a signal output from radio transceiver 12000, and the processed signal may be stored in non-volatile memory device 16000 via memory controller 15000 or displayed via display 13000. Radio transceiver 12000 may convert a signal from processor 11000 to a radio signal to output it to an external device via the antenna. An input device 14000 may be a device capable of receiving a control signal for controlling an operation of processor 11000 or data to be processed by processor 11000. Input device 14000 may include a pointing device such as a touch pad or a computer mouse, a keypad, or a keyboard. Processor 11000 may control display 13000 so as to display output data from non-volatile memory device 16000, a radio signal from radio transceiver 12000, or data from input device 14000.

Figure 10:
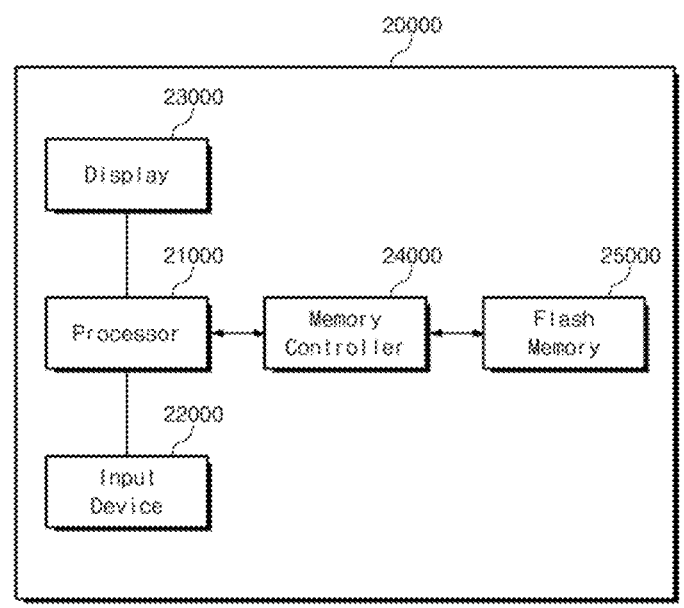

FIG. 10 is a block diagram illustrating an electronic device 20000 which may adopt charge pumps and clock generation schemes according to an embodiment of inventive concept.

Referring to FIG. 10, electronic device 20000 may be a data processing device such as a personal computer, a tablet computer, a net-book, an e-reader, a PDA, a PMP, an MP3 player, or an MP4 player, and may include a non-volatile memory device 25000 such as a flash memory device and a memory controller 24000 controlling an operation of non-volatile memory device 25000. Non-volatile memory device 25000 may, for example, include charge pumps coupled to clock generation circuits according to embodiments of inventive concept in order to generate high voltages needed in programming memory cells.

Electronic device 20000 further comprises a processor 21000 controlling an overall operation of electronic device 20000. Memory controller 24000 may be controlled by processor 21000.

Processor 21000 may display data stored in a non-volatile memory device via a display 23000 according to an input signal generated by an input device 22000. For example, input device 22000 may be formed of a pointing device such as a touch pad or a computer mouse, a keypad, or a keyboard.

Figure 11:
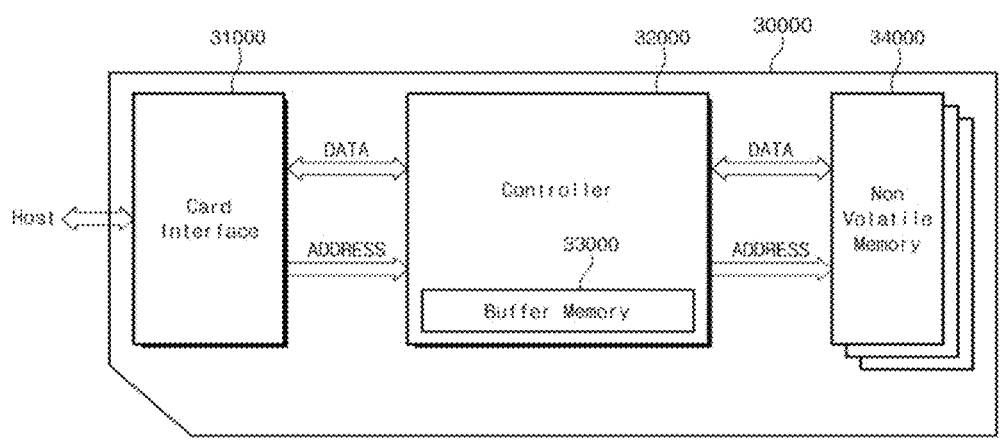

FIG. 11 is a block diagram illustrating an electronic device 3000 which may adopt charge pumps and clock generation schemes according to an embodiment of inventive concept.

Referring to FIG. 11, electronic device 30000 comprises a card interface 31000, a memory controller 32000, and at least one non-volatile memory device 34000, for example, a flash memory device.

Electronic device 30000 exchanges data with a host via card interface 31000. In some embodiments, card interface 31000 may be an SD card interface or an MMC interface, although embodiments of inventive concept are not limited thereto. Card interface 31000 may exchange data between the host and memory controller 32000 according to the communication protocol of the host capable of communicating with electronic device 30000.

Memory controller 32000 may control an overall operation of electronic device 30000, and may control data exchange between card interface 31000 and non-volatile memory device 34000. A buffer memory 33000 of memory controller 32000 may buffer data transferred between card interface 31000 and the at least one non-volatile memory device 34000.

Memory controller 32000 is connected to card interface 31000 and non-volatile memory device 34000 via a data bus and an address bus. In some embodiments, memory controller 32000 receives an address of data to be read or written via the address bus from card interface 31000 to send it to the at least one non-volatile memory device 34000. Memory controller 32000 receives or sends data to be read or to be written via the data bus connected to card interface 31000 or the at least one non-volatile memory device 34000.

The at least one non-volatile memory device 34000 may, for example, include charge pumps coupled to clock generation circuits according to embodiments of inventive concept in order to generate high voltages needed in programming memory cells.

Where electronic device 30000 in FIG. 18 is connected to a host such as a PC, a tablet PC, a digital camera, a digital audio player, a cellular phone, a console video game hardware, or a digital set-top box, the host may send or receive data stored in non-volatile memory device 34000 via card interface 31000 and memory controller 32000.

Figure 12:
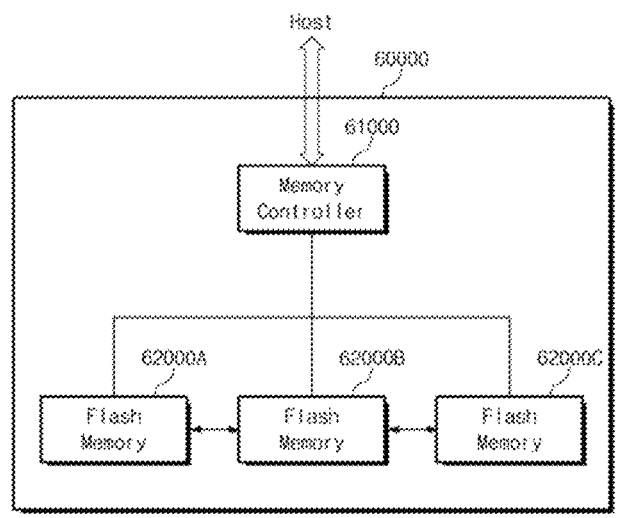

FIG. 12 is a block diagram illustrating an electronic device 60000 which may adopt charge pumps and clock generation schemes according to an embodiment of inventive concept. Electronic device 60000 may be implemented by a data storage device such as a Solid State Drive (SSD).

Figure 13:
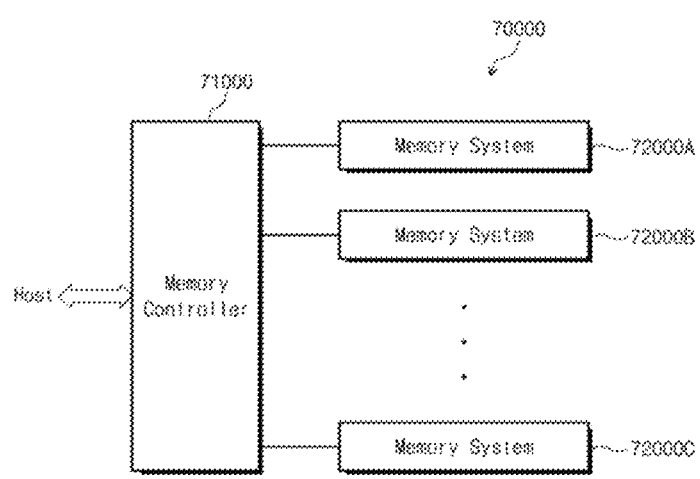

Referring to FIG. 13, electronic device 60000 comprises multiple non-volatile memory devices 62000A, 62000B, and 62000C, and a memory controller 61000 controlling a data processing operation of each of the non-volatile memory devices 62000A, 62000B, and 62000C. Electronic device 60000 may be implemented by a memory system or a memory module.

Each of non-volatile memory devices 62000A, 62000B, and 62000C may, for example, include charge pumps coupled to clock generation circuits according to embodiments of inventive concept in order to generate high voltages needed in programming memory cells. In general, memory controller 61000 may be provided at the interior or exterior of electronic device 60000.

FIG. 13 is a block diagram illustrating a data processing system including an electronic device in FIG. 12.

Referring to FIGS. 12 and 13, a data storage device 70000 may be implemented by a Redundant Array of Independent Disks (RAID) system, and may include a RAID controller 71000 and multiple memory systems 72000A to 72000C.

Memory systems 72000A to 72000C may be an electronic device 60000 illustrated in FIG. 2. Memory systems 72000A to 72000C may constitute a RAID array. Data storage device 70000 may be implemented by a personal computer or an SSD.

During a program operation, RAID controller 71000 may output program data from a host to one of memory systems 72000A to 72000C according to a RAID level, selected depending on RAID level information from the host, from among multiple RAID levels.

During a read operation, RAID controller 71000 may provide the host with read data from one of memory systems 72000A to 72000C according to a RAID level, selected depending on RAID level information from the host, from among multiple RAID levels.

The foregoing is illustrative of embodiments and is not to be construed as limiting thereof. Although a few embodiments have been described, those skilled in the art will readily appreciate that many modifications are possible in the embodiments without departing from the scope of the inventive concept as defined in the claims.

What is claimed is:

1. A charge pump comprising:
   a voltage multiplier core including first and second cross-coupled CMOS devices, first and second output CMOS devices, a first capacitive node coupled between the first cross-coupled CMOS device and the first output CMOS device, and a second capacitive node coupled between the second cross-couple CMOS device and the second output CMOS device; and
   a clocking circuit configured to control the first and second output CMOS devices to inhibit a drop in respective output voltages therefrom, while simultaneously controlling the first and second cross-coupled CMOS device and input voltages applied to the first and second capacitive nodes to minimize leakage from the first and second capacitive nodes.

2. The charge pump of claim 1, wherein the first and second cross-coupled CMOS devices are NMOS transistors, and the first and second output CMOS devices are PMOS devices.

3. The charge pump of claim 2, further comprising a capacitive element and an inverter coupled in series to each of the first and second capacitive nodes.

4. The charge pump of claim 3, wherein the clocking circuit comprises:
   a first clock generator configured to generate a non-overlapping first pair of inverted clock signals and a non-overlapping second pair of inverted clock signals which are synchronized with the first pair of inverted clock signals; and
   a second clock generator configured to generate an overlapping third pair of inverted clock signals which are synchronized with the first and second pair of inverted clock signals,
   wherein respective transitions of the first pair of inverted clock signals are separated in time by a first transition window,
   wherein respective transitions of the second pair of inverted clock signals are separated in time by a second transition window which overlaps the first transition window, and
   wherein each transition of the third pair of inverted clock signals occurs in the first and second transition windows of the respective first and second pairs of inverted clock signals.

5. The charge pump of claim 4, wherein the clocking circuit further comprises:
   a first booster circuit configured to voltage boost the second pair of inverted clock signals; and a second booster circuit configured to voltage boost the third pair of inverted clock signals.

6. The charge pump of claim 5, wherein the boosted second pair of inverted clock signals are respectively gated to the NMOS transistors, wherein the boosted third pair of inverted clock signals are respectively gated to the PMOS transistors, and wherein the first pair of inverted clock signals are respectively gated to inputs of the first and second inverters.

7. The charge pump of claim 4, wherein the first clock generator receives a main clock signal, and the second clock generator comprises:

a delay element having an input which receives the main clock signal, and output which generates a first one of the third pair of inverted clock signals; and an inverter having an input which receives the first one of the third pair of inverted clock signals, and an output which generates a second one of the third pair of inverted clock signals.

8. The charge pump of claim 7, further comprising a first booster having a first input coupled to the output of the delay element, a second input coupled to the output of the inverter, and first and second outputs generating an overlapping pair of boosted inverted clock signals.

9. A method of controlling a voltage multiplier core including first and second cross-coupled CMOS devices, first and second output CMOS devices, a first capacitive node coupled between the first cross-coupled CMOS device and the first output CMOS device, and a second capacitive node coupled between the second cross-couple CMOS device and the second output CMOS device, said method comprising:

controlling the first and second output CMOS devices to inhibit a drop in respective output voltages there from, while simultaneously controlling the first and second cross-coupled CMOS device and input voltages applied to the first and second capacitive nodes to minimize leakage from the first and second capacitive nodes.

\* \* \* \* \*